(12) United States Patent
Baek et al.

(10) Patent No.: US 9,875,994 B2
(45) Date of Patent: Jan. 23, 2018

(54) MULTI-CHIP PACKAGE, SYSTEM AND TEST METHOD THEREOF

(71) Applicant: SK hynix Inc., Gyeonggi-do (KR)

(72) Inventors: Chang-Ki Baek, Gyeonggi-do (KR); Joon-Woo Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/047,393

(22) Filed: Feb. 18, 2016

(65) Prior Publication Data

US 2017/0084580 A1    Mar. 23, 2017

(30) Foreign Application Priority Data

Sep. 18, 2015  (KR) .................. 10-2015-0132268

(51) Int. Cl.
*H01L 25/065* (2006.01)
*G01R 31/3185* (2006.01)
*H01L 23/00* (2006.01)

(52) U.S. Cl.
CPC .. *H01L 25/0657* (2013.01); *G01R 31/318513* (2013.01); *H01L 24/06* (2013.01); *H01L 24/48* (2013.01); *H01L 24/49* (2013.01); *H01L 2224/04042* (2013.01); *H01L 2224/06135* (2013.01); *H01L 2224/48227* (2013.01); *H01L 2224/49175* (2013.01); *H01L 2225/0651* (2013.01); *H01L 2225/06562* (2013.01)

(58) Field of Classification Search
CPC .... G01R 31/318513; G01R 31/318541; H01L 25/0657
See application file for complete search history.

(56) References Cited

U.S. PATENT DOCUMENTS 5,568,068 A * 10/1996 Ota ................... H03K 19/00323
                                                         326/21
7,842,949 B2 * 11/2010 Whetsel ......... G01R 31/318541
                                                        257/48

FOREIGN PATENT DOCUMENTS

| KR | 1020060024183 | 3/2006 |
| KR | 100728564 | 6/2007 |
| KR | 1020110131648 | 12/2011 |
| KR | 1020140071641 | 6/2014 |

* cited by examiner

*Primary Examiner* — Lincoln Donovan
*Assistant Examiner* — Colleen O Toole
(74) *Attorney, Agent, or Firm* — IP & T Group LLP (57) ABSTRACT

A multi-chip package may include a plurality of semiconductor chips integrated in a single package and sharing one or more command pins. Each of the semiconductor chips may include: a command decoder suitable for decoding a command to generate a buffer enable signal, a mode enable signal, and a mode signal; a data input buffer suitable for buffering data to output internal data, in response to the buffer enable signal and a common test mode signal; a command controller suitable for receiving the mode enable signal to output a test mode enable signal by selectively blocking the mode enable signal based on the internal data and the common test mode signal; and a test controller suitable for generating the common test mode signal and a test mode signal, based on the test mode enable signal and the mode signal.

14 Claims, 9 Drawing Sheets

MULTI-CHIP PACKAGE, SYSTEM AND TEST METHOD THEREOF

CROSS-REFERENCE TO RELATED APPLICATIONS

The present application claims priority of Korean Patent Application No. 10-2015-0132268, filed on Sep. 18, 2015, which is incorporated herein by reference in its entirety.

BACKGROUND

1. Field

Exemplary embodiments of the present invention relate to a semiconductor design technology and more particularly, to a multi-chip package (MCP), system and a test method thereof.

2. Description of the Related Art

Mobile applications such as PDA (Personal Digital Assistant), third-generation mobile phone, and digital still camera applications require miniaturization. Generally, satisfactory miniaturization has been achieved through the use of submicron semiconductor fabrication technologies. However, continuous demand for ever increasing miniaturization has tested the limits of existing submicron technologies resulting in extended development periods and increased manufacturing costs.

To address these limitations, especially for mobile applications, a Multi-Chip Package (MCP) technology has been introduced allowing a variety of semiconductor chips, such as a NOR flash memory, a NAND flash memory, an SRAM, and a UtRAM to be mounted in a single package. Generally, MCPs with a stack of four or more semiconductor chips are known. By employing MCP technology, the internal mounting area can be reduced by 50% or more and the line structure can be simplified as compared to using a plurality of single packages. Thus, MCP technology can reduce the cost of products and increase productivity significantly.

However, due to the use of many chips, a large number of pins exist in an MCP product that can obstruct manufacturing of the product. For reducing the number of pins, the semiconductor chips included in a single MCP can be configured to share command pins.

Figure 1A:
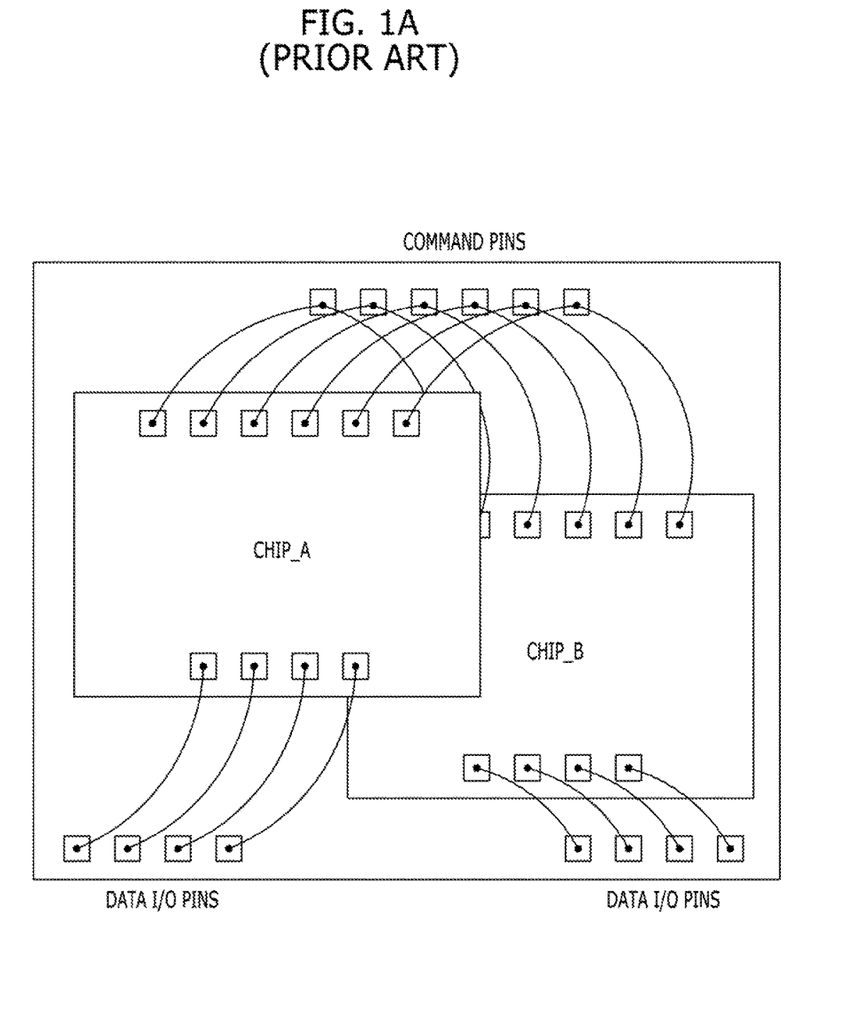
FIG. 1A is a diagram illustrating a conventional Multi-Chip Package (MCP).

Referring to FIG. 1A a conventional MCP is provided including a plurality of semiconductor chips CHIP_A and CHIP_B mounted in a single package. Each of the semiconductor chips CHIP_A and CHIP_B includes a plurality of command pins COMMAND PINs and a plurality of data pins DATA I/O PINs. The data pins DATA I/O PINs are individually provided for each of the semiconductor chips CHIP_A and CHIP_B, while the command pins COMMAND PINs are shared by the semiconductor chips CHIP_A and CHIP_B.

Figure 1B:
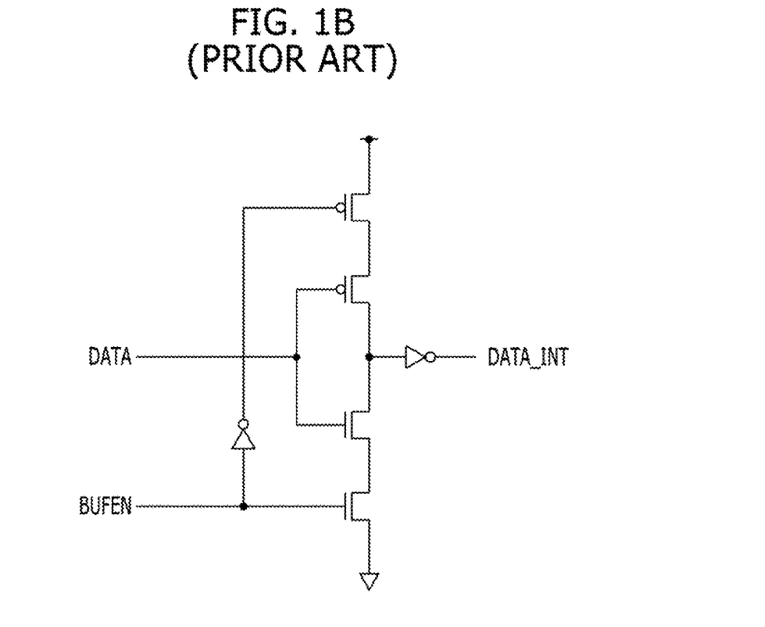
FIG. 1B is a circuit diagram Illustrating a data input buffer included in each semiconductor chip shown in FIG. 1A.

FIG. 1B is a circuit diagram of a data input buffer included in each of the semiconductor chips CHIP_A and CHIP_B shown in FIG. 1A.

Referring to FIG. 1B, the data input buffer includes two pull-up PMOS transistors and two pull-down NMOS transistors. When a buffer enable signal BUFEN, which is generated by decoding commands inputted through command pins, is activated, the data input buffer buffers external data DATA inputted through a data pin and outputs the buffered data as internal data DATA_INT.

When a test operation is performed on the MCP, each of semiconductor chips CHIP_A and CHIP_B included the MCP is respectively targeted. However, since the command pins are shared, the semiconductor chips CHIP_A and CHIP_B cannot be independently tested. After all of the semiconductor chips CHIP_A and CHIP_B enter a test mode, a test operation is performed in response to the same command. Thus, there is a need for a new method capable of independently testing the semiconductor chips included in an MCP without having an influence on the entire area of the MCP.

SUMMARY

Various embodiments are directed to an MCP, having a plurality of semiconductor chips that share one or more command pins and are integrated in one package, which may independently perform a test operation, a test operation method of an MCP, and an MCP system.

In an embodiment, a multi-chip package (MCP) may include a plurality of semiconductor chips integrated in a single package and sharing one or more command pins. Each of the semiconductor chips may include: a command decoder suitable for decoding a command to generate a buffer enable signal, a mode enable signal, and a mode signal; a data input buffer suitable for buffering data to output internal data, in response to the buffer enable signal and a common test mode signal; a command controller suitable for receiving the mode enable signal to output a test mode enable signal by selectively blocking the mode enable signal based on the internal data and the common test mode signal; and a test controller suitable for generating the common test mode signal and a test mode signal, based on the test mode enable signal and the mode signal.

In an embodiment, there is provided a test method of a multi-chip package having a plurality of semiconductor chips integrated in one package and sharing at least one command pin. The test method may include: entering a common test mode based on a command inputted through the at least one command pin; selectively activating a masking signal based on data inputted through a data pin; setting an individual test mode based on a command inputted through the at least one command pin when the masking signal is deactivated; deactivating a test mode enable signal by blocking the command inputted through the command pin when the masking signal is activated; deactivating the masking signal according to data inputted through the data pin; and ending the common test mode based on a command inputted through the at least one command pin.

In an embodiment, a multi-chip package system may include: a multi-chip package comprising a plurality of semiconductor chips which share at least one command pin and are integrated in one package; and a controller suitable for transmitting a command to the multi-chip package and exchanging data corresponding to the command with the multi-chip package. Each of the semiconductor chips of the multi-chip package may comprise a plurality of data pins, and selectively sets a test mode of a semiconductor chip to be tested by blocking a command inputted through the command pin according to a value of data inputted through the data pins in a common test mode.

DETAILED DESCRIPTION

Various embodiments of the invention will be described below in more detail with reference to the accompanying drawings. The present invention may, however, be embodied in different forms and should not be construed as being limited to the embodiments set forth herein. Rather, these embodiments are provided so that this disclosure will be thorough and complete to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
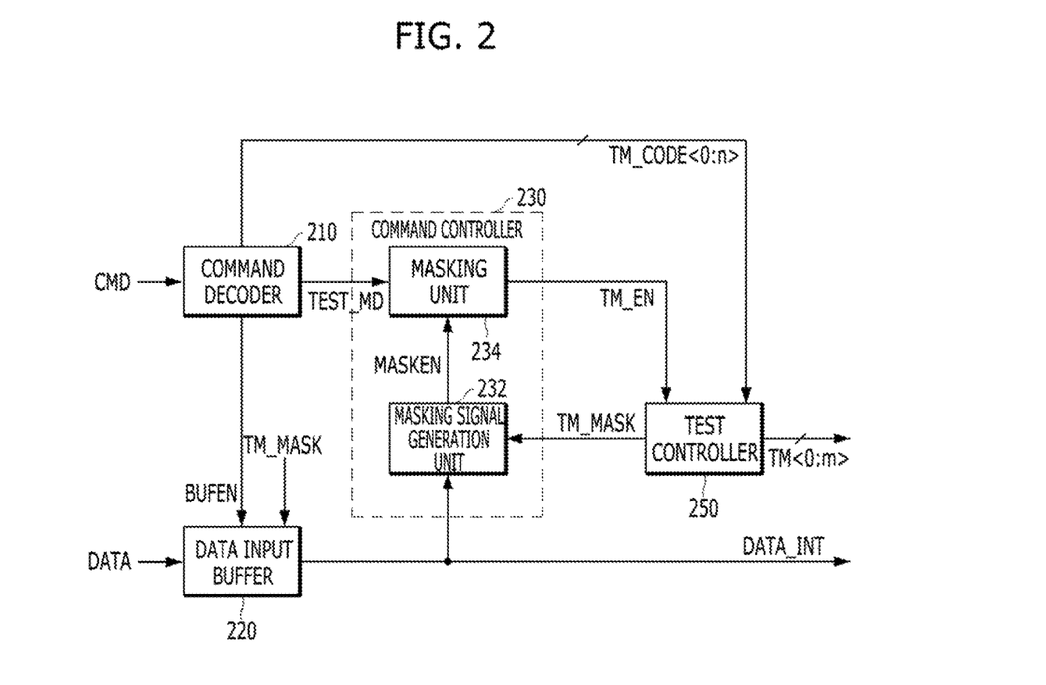
FIG. 2 is a block diagram illustrating a semiconductor chip included in an MCP, according to an embodiment of the present invention.

Referring now to FIG. 2 is a block diagram Illustrating a semiconductor chip included in an MCP, according to an embodiment of the present invention.

Referring to FIG. 2, the semiconductor chip may include a command decoder 210, a data input buffer 220, a command controller 230, and a test controller 250.

The command decoder 210 may decode a command CMD (i.e., a combination of command signals) inputted from an external device or source through command pins (not illustrated), and may generate command signals required for an internal operation. In an embodiment of the present invention, the command decoder 210 may generate a buffer enable signal BUFEN, a mode enable signal TEST_MD, and a mode signal TM_CODE<0:n> as commands required for internal operation. Each command signal may comprise a plurality of bits.

The data input buffer 220 may buffer data DATA Inputted from an external device or source through a data pin (not Illustrated) and output internal data DATA_INT, in response to the buffer enable signal BUFEN and a common test mode signal TM_MASK. When any one of the buffer enable signal BUFEN and the common test mode signal TM_MASK is activated, the data input buffer 220 may buffer the data DATA and output the internal data DATA_INT.

The command controller 230 may receive the mode enable signal TEST_MD and output a test mode enable signal TM_EN. The command controller 230 may selectively block the mode enable signal TEST_MD and output the test mode enable signal TM_EN, in response to the internal data DATA_INT and the common test mode signal TM_MASK.

More specifically, the command controller 230 may include a masking signal generation unit 232 and a masking unit 234.

The masking signal generation unit 232 may receive the internal data DATA_INT and generate a mask enable signal MASKEN, in response to the common test mode signal TM_MASK. When the common test mode signal TM_MASK is activated, the masking signal generation unit 232 may activate the mask enable signal MASKEN according to the value of the internal data DATA_INT. When the common test mode signal TM_MASK is deactivated, the masking signal generation unit 232 may deactivate the mask enable signal MASKEN regardless of the value of the Internal data DATA_INT.

The masking unit 234 may selectively block the mode enable signal TEST_MD in response to the mask enable signal MASKEN, and output the test mode enable signal TM_EN.

The test controller 250 may generate the common test mode signal TM_MASK and a test mode signal TM<0:m> for an internal test operation, in response to the test mode enable signal TM_EN and the mode signal TM_CODE<0:n>.

An operation of the semiconductor chip according to an embodiment of the present invention will now be described.

The command decoder 210 may decode the command CMD inputted from the outside through the common command pins (not illustrated), and generate the mode enable signal TEST_MD and the mode signal TM_CODE<0:n> composed of a plurality of bits. Since the mask enable signal MASKEN is deactivated at the initial stage, the masking unit 234 may output the mode enable signal TEST_MD as the test mode enable signal TM_EN. The test controller 250 may activate the common test mode signal TM_MASK in response to the test mode enable signal TM_EN and the mode signal TM_CODE<0:n>. Thus, the semiconductor chip may enter the common test mode.

When the semiconductor chip enters the common test mode, the data input buffer 220 may buffer data DATA inputted through a data pin individually provided for the semiconductor chip and output the buffered data as internal data DATA_INT, in response to the activated common test mode signal TM_MASK. The masking signal generation unit 232 may receive the internal data DATA_INT and selectively activate the mask enable signal MASKEN, in response to the activated common test mode signal TM_MASK.

When a command for individual test mode setting is inputted from an external device or source through the common command pins, the masking unit 234 may selectively block the mode enable signal TEST_MD according to the corresponding mask enable signal MASKEN, and output the test mode enable signal TM_EN. When the mask enable signal MASKEN is activated, the masking unit 234 may block the mode enable signal TEST_MD, and deactivate and output the test mode enable signal TM_EN. Thus, the test controller 250 may not generate the test mode signal TM<0:m> for an internal test operation. On the other hand, when the mask enable signal MASKEN is deactivated, the masking unit 234 may output the mode enable signal TEST_MD as the test mode enable signal TM_EN. Thus, the test controller 250 may generate the test mode signal TM<0:m> for an internal test operation.

That is, after entering the common test mode, each of the semiconductor chips may selectively block the mode enable signal TEST_MD according to data inputted through an individual data pin, and output the test mode enable signal TM_EN. Since the semiconductor chip which blocks the mode enable signal TEST_MD does not generate the test mode signal TM<0:m>, the semiconductor chip may not perform an individual test mode setting operation. On the other hand, the semiconductor chip which does not block the mode enable signal TEST_MD may generate the test mode signal TM<0:m>. Thus, an internal circuit (not Illustrated) of the corresponding semiconductor chip may perform an individual test mode setting operation. For reference, the individual test mode setting operation may be performed to set a voltage for a specific test operation, delay amounts of signals, and a margin for compensating a variable caused by a process difference.

Then, the mask enable signal MASKEN which has been activated according to data DATA inputted through the data pin may be deactivated.

As the above-described process is repeated, each of the semiconductor chips may perform an independent test mode setting operation.

Then, when the command CMD is inputted from an external device or source through the common command pins (not illustrated), the test controller 250 may deactivate the common test mode signal TM_MASK in response to the test mode enable signal TM_EN and the mode signal TM_CODE<0:n>. Then, the common test mode may end.

In the embodiment of the present invention, although the same command is inputted to the respective semiconductor chips at the same time, the commands of the semiconductor chips other than the test target may be selectively blocked. Thus, only the semiconductor chip corresponding to the test target may be independently tested.

Hereafter, referring to FIGS. 3 to 68, the components of FIG. 2 will be described in more detail.

Figure 3:
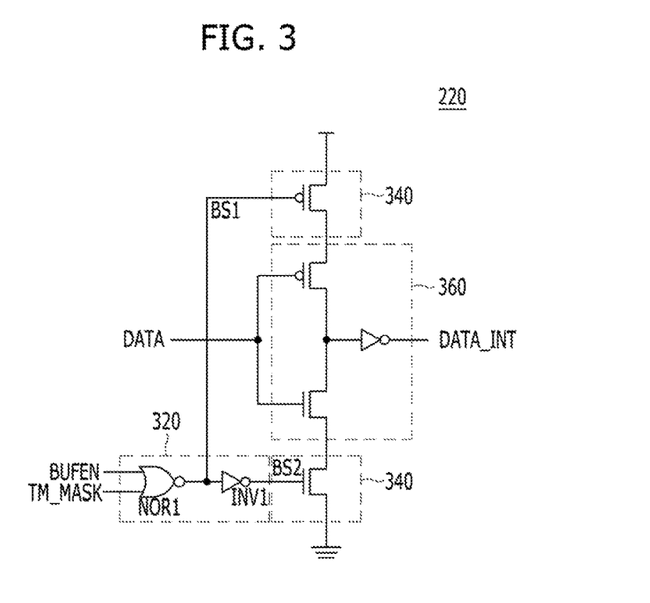
FIG. 3 is a detailed diagram of a data input buffer shown in FIG. 2.

FIG. 3 is a detailed diagram of the data input buffer 220 shown in FIG. 2.

Referring to FIG. 3, the data input buffer 220 may include an enable signal generation unit 320, an enable unit 340, and a driving unit 360.

The enable signal generation unit 320 may receive the buffer enable signal BUFFN and the common test mode signal TM_MASK, and generate first and second enable signals BS1 and BS2. In an embodiment, the enable signal generation unit 320 may include a NOR gate NOR1 and an inverter INV1. The NOR gate NOR1 may receive the buffer enable signal BUFEN and the common test mode signal TM_MASK, and perform a NOR operation for outputting the first enable signal BS1. The inverter INV1 may invert the output of the NOR gate NOR1 and output the second enable signal BS2.

The enable unit 340 may allow a driving voltage to be supplied to the driving unit 360 in response to the first and second enable signals BS1 and BS2.

The driving unit 360 may drive data DATA inputted from outside through a data pin (not illustrated) to internal data DATA_INT according to the driving voltage supplied from the enable unit 340.

Thus, when any one of the buffer enable signal BUFEN and the common test mode signal TM_MASK is enabled, the data input buffer 220 may buffer the data DATA and output the internal data DATA_INT.

Figure 4:
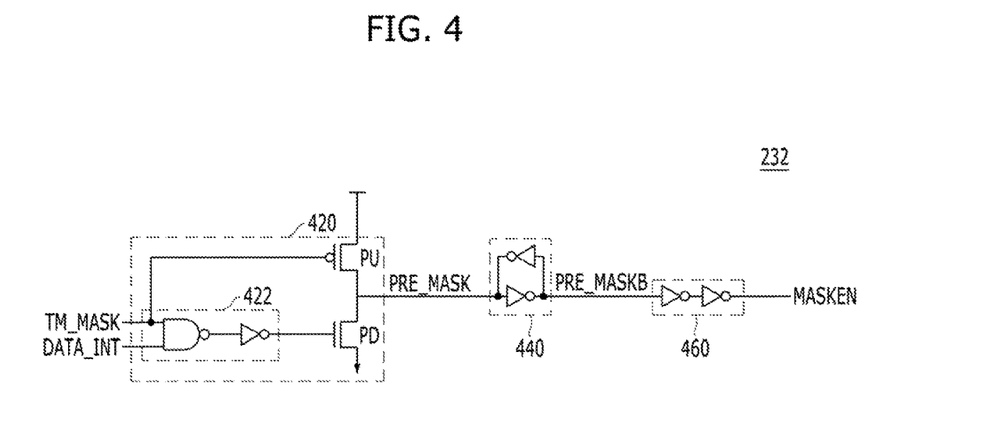
FIG. 4 is a detailed diagram of a masking signal generation unit shown in FIG. 2.

FIG. 4 is a detailed diagram of the masking signal generation unit 232 shown in FIG. 2.

Referring to FIG. 4, the masking signal generation unit 232 may include a signal driving unit 420, a latch unit 440, and a buffer unit 460.

The signal driving unit 420 may receive the common test mode signal TM_MASK and the internal data DATA_INT, and generate a pre-mask signal PRE_MASK. The latch unit 440 may latch the pre-mask signal PRE_MASK and output an inverted pre-mask signal PRE_MASKB. The buffer unit 460 may buffer the inverted pre-mask signal PRE_MASKB and generate the mask enable signal MASKEN.

The signal driving unit 420 may include a pull-up driving unit PU, a logic circuit 422, and a pull-down driving unit PD. The pull-up driving unit PU may pull-up drive the pre-mask signal PRE_MASK in response to the common test mode signal TM_MASK, the logic circuit 422 may perform an AND operation on the common test mode signal TM_MASK and the internal data DATA_INT, and the pull-down driving unit PD may pull-down drive the pre-mask signal PRE_MASK in response to an output signal of the logic circuit.

Thus, when the common test mode signal TM_MASK is activated, the masking signal generation unit 232 may activate the mask enable signal MASKEN according to the value of the internal data DATA_INT. When the common test mode signal TM_MASK is deactivated, the masking signal generation unit 232 may deactivate the mask enable signal MASKEN regardless of the value of the internal data DATA_INT.

Figure 5:
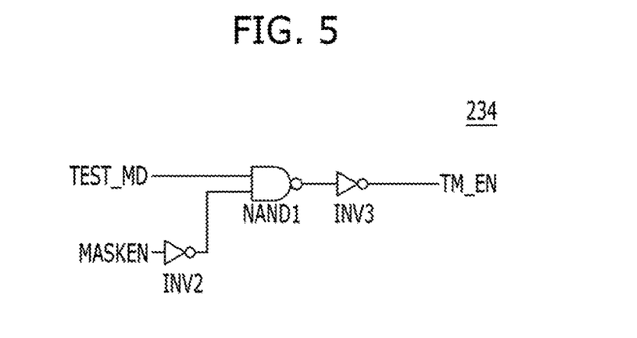
FIG. 5 is a detailed diagram of a masking unit shown in FIG. 2.

FIG. 5 is a detailed diagram of the masking unit 234 shown in FIG. 2.

Referring to FIG. 5, the masking unit 234 may include a first inverter INV2, a NAND gate NAND1, and a second inverter INV3. The first inverter INV2 may invert the mask enable signal MASKEN, and the NAND gate NAND1 and the second inverter INV3 may perform an AND operation on the output of the first inverter INV2 and the mode enable signal TEST_MD.

Thus, the masking unit 234 may output the test mode enable signal TM_EN by selectively blocking the mode enable signal TEST_MD in response to the mask enable signal MASKEN.

Figure 6A:
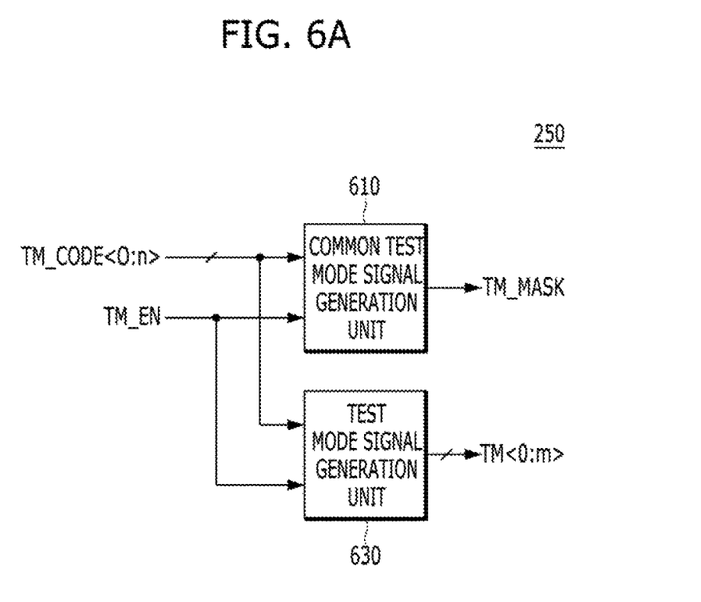
FIG. 6A is a detailed diagram of a test controller shown in FIG. 2.
Figure 6B:
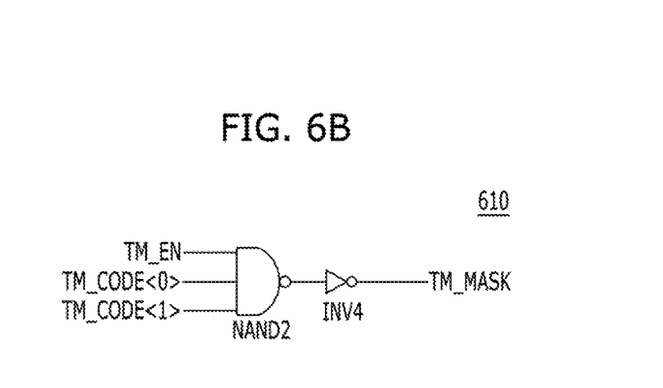
FIG. 6B is a detailed diagram of a common test mode signal generation unit shown in FIG. 6A.

FIG. 6A is a detailed diagram of the test controller 250 shown in FIG. 2.

Referring to FIG. 6A, the test controller 250 may include a common test mode signal generation unit 610 and a test mode signal generation unit 630.

The common test mode signal generation unit 610 may generate the common test mode signal TM_MASK in response to the test mode enable signal TM_EN and the mode signal TM_CODE<0:n>. The test mode signal generation unit 630 may generate the test mode signal TM<0:m> by decoding the mode signal TM_CODE<0:n> in response to the test mode enable signal TM_EN. Since the test mode signal generation unit 630 has substantially the same configuration as the existing configuration, detailed descriptions thereof are omitted herein.

FIG. 6B is a detailed diagram of the common test mode signal generation unit 610 shown in FIG. 6A.

Referring to FIG. 6B, the common test mode signal generation unit 610 may include a NAND gate NAND2 and a second inverter INV4. The NAND gate NAND2 receives the test mode enable signal TM_EN and some of bits TM_CODE<0> and TM_ODE<1> of the mode signal and performs an AND operation in company with the second inverter INV4 on the received signals.

Thus, when the test mode enable signal TM_EN is activated, the test controller 250 may decode the mode signal TM_CODE<0:n> and generate the test mode signal TM<0:m> for an internal test operation. Furthermore, when the test mode enable signal TM_EN is activated and some of bits TM_CODE<0> and TM_CODE<1> of the mode signal have a value of 11 indicating the common test mode, the test controller 250 may activate the common test mode signal TM_MASK such that the respective semiconductor chips may enter the common test mode. On the other hand, when the test mode enable signal TM_EN is activated and any one of the bits TM_CODE<0> and TM_CODE<1> of the mode signal is zero, the test controller 250 may deactivate the common test mode signal TM_MASK such that the respective semiconductor chips may end the common test mode.

Figure 7A:
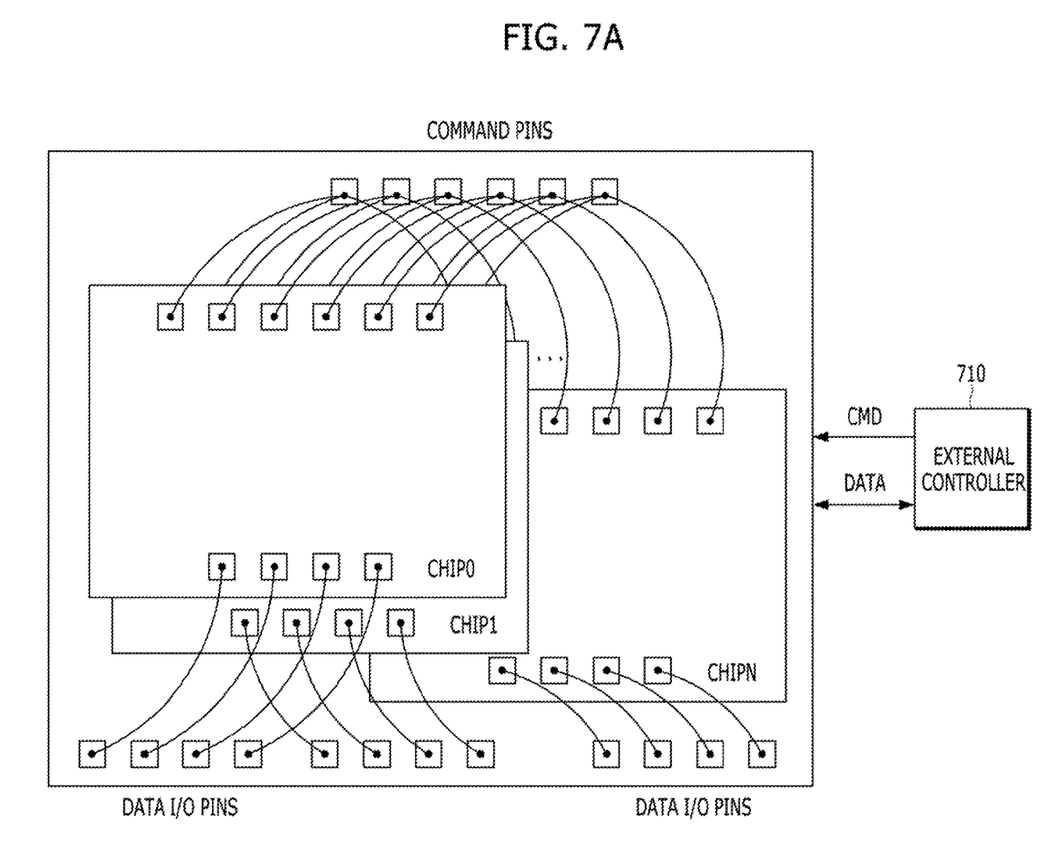
FIGS. 7A and 7B are block diagrams illustrating an MCP, according to an embodiment of the present invention.
Figure 7B:
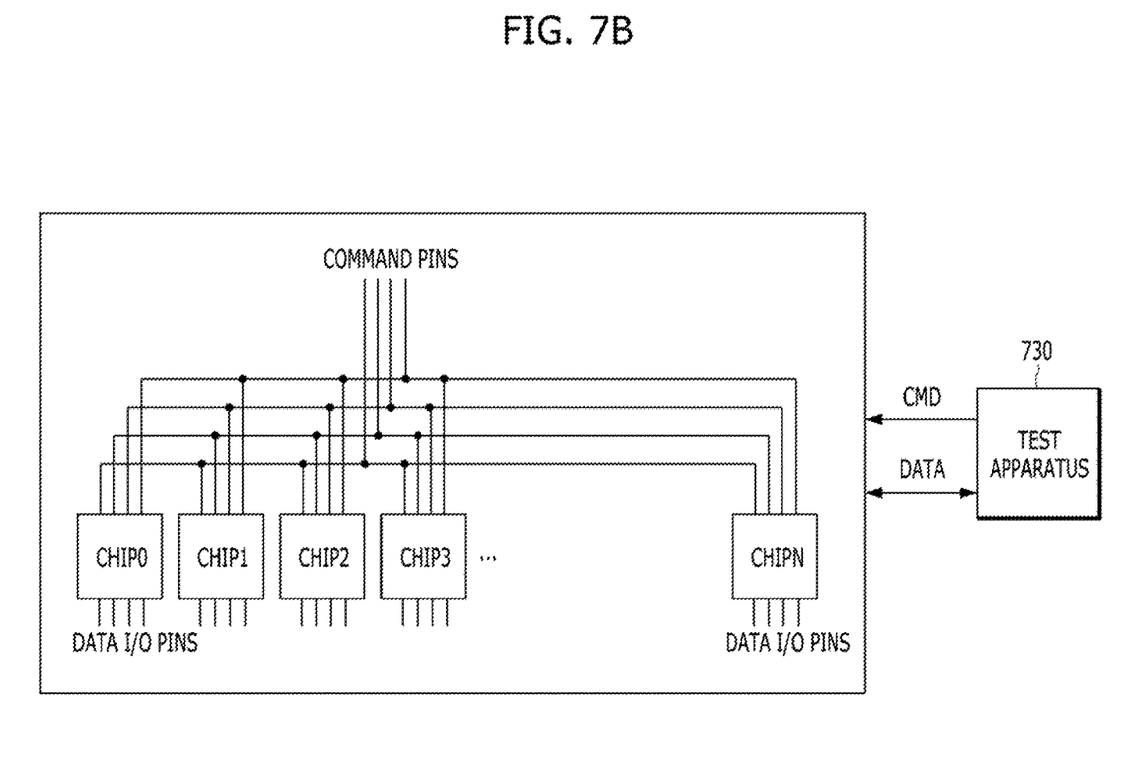

FIGS. 7A and 7B are diagrams illustrating an MCP according to an embodiment of the present invention.

FIG. 7A illustrates that a plurality of semiconductor chips CHIP0, CHIP1, . . . , CHIPN are packaged and mounted on one substrate. That is, the semiconductor chips CHIP0, CHIP1, . . . , CHIPN are mounted on one substrate to form an MCP. Each of the semiconductor chips CHIP0, CHIP1, . . . , CHIPN mounted in one package may include a plurality of command pins COMMAND PINs and a plurality of data pins DATA I/O PINs. Among the command pins and the data pins, the data pins may be individually provided for each of the semiconductor chips CHIP0, CHIP1, . . . , CHIPN, and the command pins may be shared by the semiconductor chips CHIP0, CHIP1, . . . , CHIPN. For reference, when the semiconductor chips CHIP0, CHIP1, . . . , CHIPN are mounted in one package to form an MCP, the MCP may receive a command CMD from an external controller 710, and receive and output data DATA.

FIG. 7B illustrates that the semiconductor chips are de-packaged for a test. That is, each of the semiconductor chips CHIP0, CHIP1, . . . , CHIPN may include a plurality of command pins COMMAND PINs and a plurality of data pins DATA I/O PINs. Among the command pins and the data pins, the data pins may be individually provided for each of the semiconductor chips CHIP0, CHIP1, . . . , CHIPN, and the command pins may be shared by the semiconductor chips CHIP0, CHIP1, . . . , CHIPN. For reference, when the semiconductor chips CHIP0, CHIP1, . . . , CHIPN are de-packaged for a test, the semiconductor chips CHIP0, CHIP1, . . . , CHIPN may receive the command CMD from a test apparatus 730, and receive and output the test data DATA.

Figure 8A:
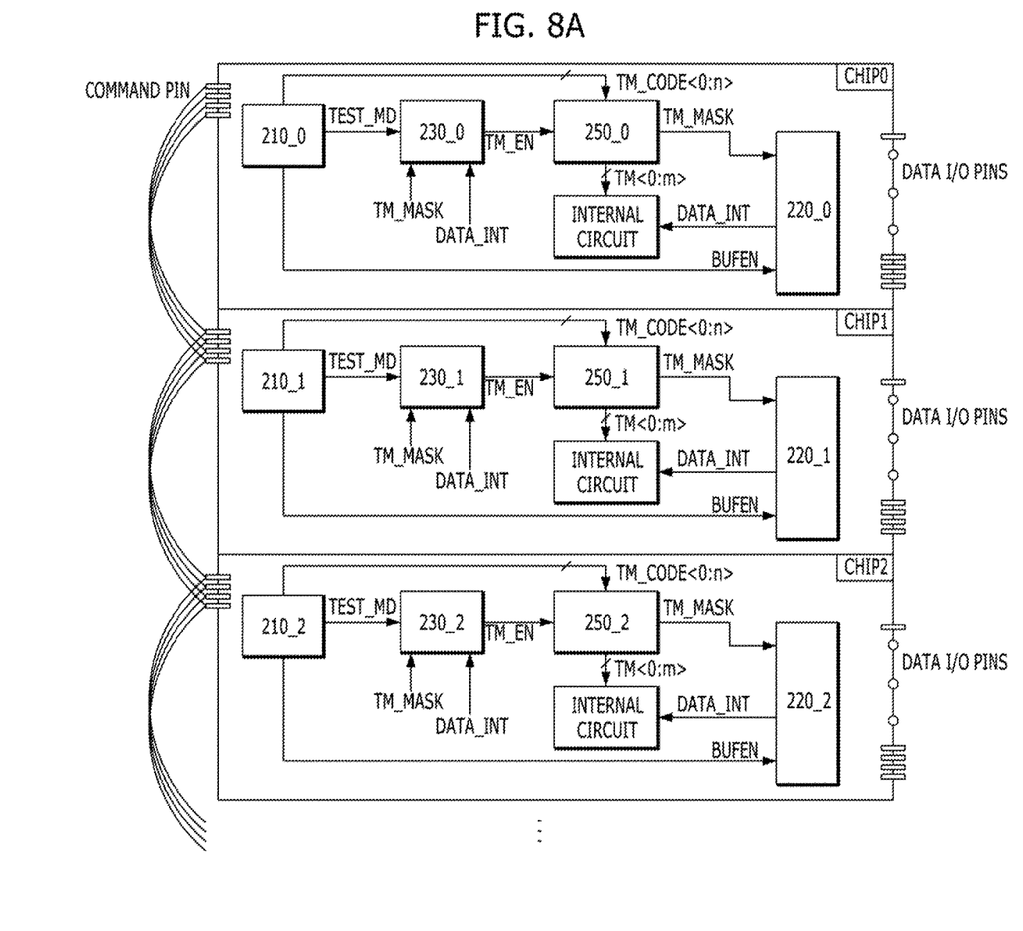
FIG. 8A is a block diagram illustrating an MCP, according to an embodiment of the present invention.
Figure 8B:
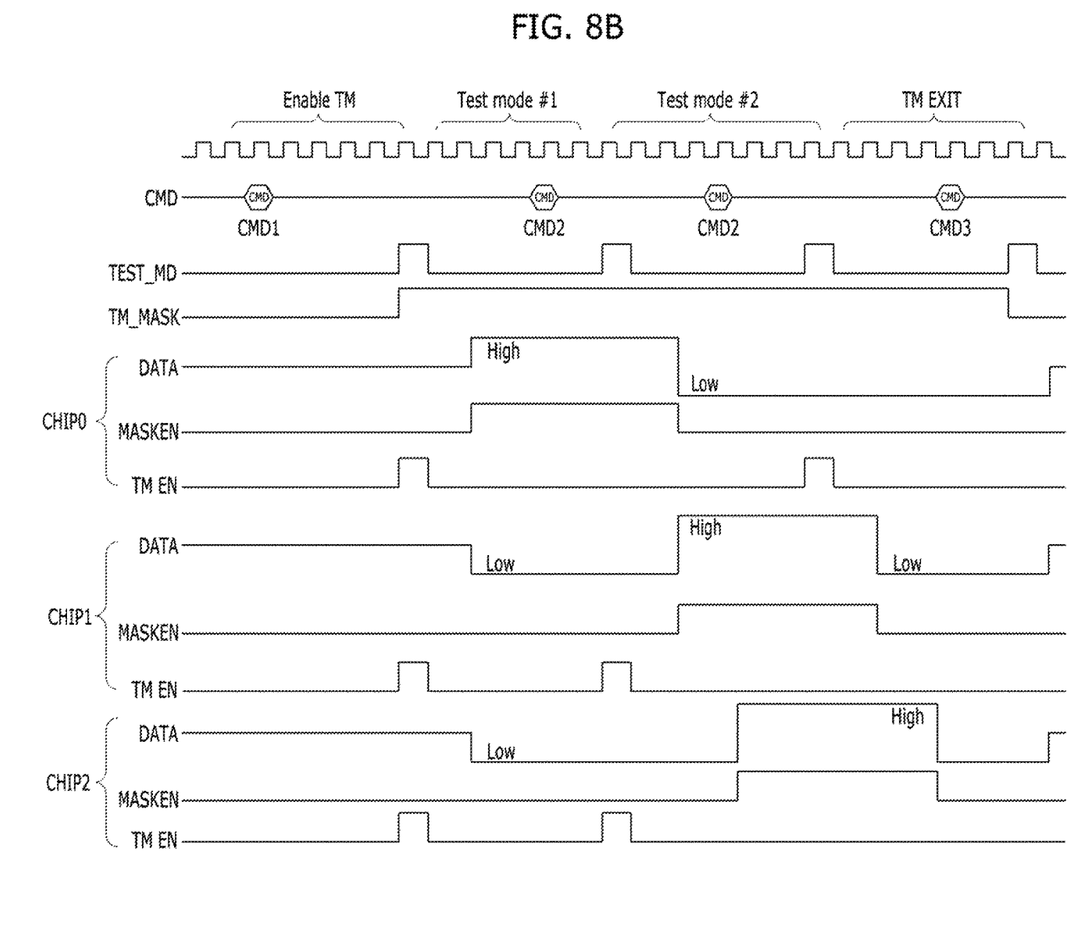
FIG. 8B is a timing diagram for an operation of the MCP illustrated in FIG. 8A.
Figure 8C:
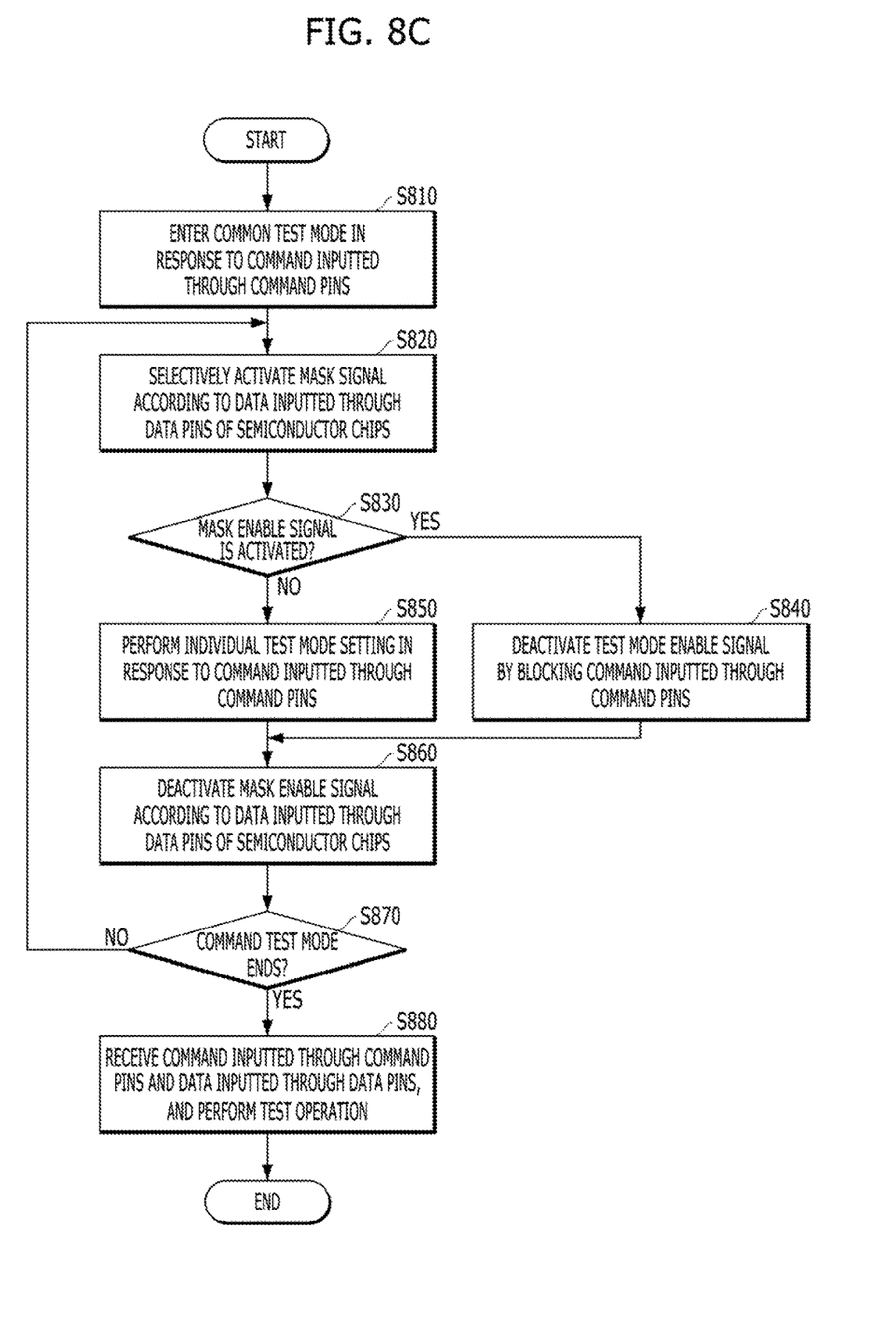
FIG. 8C is a flowchart for the operation of the MCP illustrated in FIG. 8A.

Hereafter, referring to FIGS. 8A to 8C, the configuration and operation of the semiconductor chips mounted in the MCP illustrated in FIG. 7A will be described. FIGS. 8A to 8C do not illustrate configurations related to normal operations of the respective semiconductor chips, but illustrate only the configuration related to the test operation according to the embodiment of the present invention. Furthermore, the same components as those illustrated in FIG. 2 will be represented by like reference numerals.

FIG. 8A is a block diagram illustrating an MCP according to an embodiment of the present invention. For reference, FIG. 8 shows a detailed configuration of the respective semiconductor chips of the MCP shown in FIG. 7A.

Referring to FIG. 8A, each of semiconductor chips CHIP0, CHIP1, and CHIP2 mounted in one package may include a plurality of command pins COMMAND PINs and a plurality of data pins DATA I/O PINs. The data pins may be individually provided for each of the semiconductor chips CHIP0, CHIP1, and CHIP2, and the command pins may be shared by the semiconductor chips CHIP0, CHIP1, and CHIP2. The semiconductor chips CHIP0, CHIP1, and CHIP2 may include command decoders 210_0, 210_1, and 210_2, data input buffers 220_0, 220_1, and 220_2, command controllers 230_0, 230_1, and 230_2, and test controllers 250_0, 250_1, and 250_2, respectively, which are illustrated in FIG. 2. Since the operations of the respective units have been described with reference to FIG. 2, detailed descriptions thereof are omitted herein.

FIG. 8B is a timing diagram for describing an operation of the MCP shown in FIG. 8A. FIG. 8C is a flowchart for describing the operation of the MCP shown in FIG. 8A.

Referring to FIGS. 8B and 8C, when a command CMD1 is inputted through the common command pins COMMAND PINs from the external controller 710 of FIG. 7, the command decoders 210_0, 210_1, and 210_2 of the respective chips may decode the command CMD1 and generate the mode enable signal TEST_MD and the mode signal TM_CODE<0:n>. Some of bits TM_CODE<0> and TM_CODE<1> of the mode signal TM_CODE<0:n> may have a value of 11 indicating the common test mode. Since the mask enable signal MASKEN is deactivated at the initial stage, the command controllers 230_0, 230_1, and 230_2 of the respective chips may output the mode enable signal TEST_MD as the test mode enable signal TM_EN. The test controllers 250_0, 250_1, and 250_2 of the respective chips may activate the common test mode signal TM_MASK in response to the test mode enable signal TM_EN and the bits TM_CODE<0> and TM_CODE<1> of the mode signal TM_CODE<0:n>. Thus, the respective semiconductor chips may enter the common test mode at step S810. All of the semiconductor chips of the MCP may enter the common test mode at the same time.

When the semiconductor chips enter the common test mode, the data input buffers 220_0, 220_1, and 220_2 of the respective semiconductor chips may be activated in response to the activated common test mode signal TM_MASK, buffer data DATA inputted through the individual data pins DATA I/O PINs, and output the buffered data as internal data DATA_INT.

When the data DATA inputted to the first semiconductor chip CHIP0 has a high level logic, the command controller 230_0 of the first semiconductor chip CHIP0 may activate the mask enable signal MASKEN at step S820. On the other hand, since the data DATA inputted to the second and third semiconductor chips CHIP1 and CHIP2 have a low level logic, the command controllers 230_1 and 230_2 of the second and third semiconductor chips CHIP1 and CHIP2 may deactivate the mask enable signal MASKEN.

Then, when a command CMD2 for individual test mode setting is inputted through the common command pins COMMAND PINs from the external controller, the command decoders 210_0, 210_1, and 210_2 of the respective chips may decode the command CMD2 and generate the mode enable signal TEST_MD and the mode signal TM_CODE<0:n>. The command controllers 230_0, 230_1, and 230_2 of the respective semiconductor chips may selectively block the mode enable signal TM_EN according to the corresponding mask enable signals MASKEN, and output the test mode enable signal TM_EN.

When the first semiconductor chip CHIP0 in which the mask enable signal MASKEN is activated (YES at step S830), the command controller 230_0 may block the mode enable signal TEST_MD and deactivate and output the test mode enable signal TM_EN, at step S840. Thus, the test controller 250_0 of the first semiconductor chip CHIP0 may not generate the test mode signal TM<0:m> for an internal test operation.

On the other hand, in the case of the second and third semiconductor chips CHIP1 and CHIP2 in which the mask enable signal MASKEN is deactivated (NO at step S830), the command controllers 230_1 and 230_2 may activate and output the mode enable signal TEST_MD as the test mode enable signal TM_EN. The test controllers 250_1 and 250_2 of the second and third semiconductor chips CHIP1 and CHIP2 may generate the test mode signal TM<0:m> for an internal test operation. Thus, the internal circuits of the second and third semiconductor chips CHIP1 and CHIP2 may perform an individual test mode setting operation at step S850. For reference, the individual test mode setting operation may be performed to set a voltage for a specific test operation, delay amounts of signals, and a margin for compensating a variable caused by a process difference.

Then, the data DATA inputted to the first semiconductor chip CHIP0 may transition from a high level logic to a low level logic. Thus, the command controller 230_0 of the first semiconductor chip CHIP0 may deactivate the mask enable signal MASKEN at step S860.

The individual test mode setting operation may be continuously repeated until the common test mode ends (NO at step S870).

For example, when the data DATA Inputted to the second and third semiconductor chips CHIP1 and CHIP2 have a high level logic, the command controllers 230_1 and 230_2 of the second and third semiconductor chips CHIP1 and CHIP2 may activate the corresponding mask enable signals MASKEN at step S820. Since the data DATA inputted to the first semiconductor chip CHIP0 has a high level logic, the command controller 230_0 of the first semiconductor chip CHIP0 may deactivate the mask enable signal MASKEN.

Then, when another command CMD3 for individual test mode setting is inputted through the common command pins COMMAND PINs from the external controller, the command decoders 210_0, 210_1, and 210_2 of the respective chips may decode the command CMD3 and generate the mode enable signal TEST_MD and the mode signal TM_CODE<0:n>. The command controllers 230_0, 230_1, and 230_2 of the respective semiconductor chips may selectively block the mode enable signal TM_EN according to the corresponding mask enable signals MASKEN, and output the test mode enable signal TM_EN.

When the second and third semiconductor chips CHIP1 and CHIP2 in which the mask enable signal MASKEN is activated (YES at step S830), the command controllers 230_1 and 230_2 may block the mode enable signal TEST_MD and deactivate and output the test mode enable signal TM_EN, at step S840. Thus, the test controllers 250_1 and 250_2 of the second and third semiconductor chips CHIP1 and CHIP2 may not generate the test mode signal TM<0:m> for an internal test operation.

On the other hand, in the case of the first semiconductor chip CHIP0 in which the mask enable signal MASKEN is deactivated (NO at step S830), the command controller 230_0 may activate and output the mode enable signal TEST_MD as the test mode enable signal TM_EN. The test controller 250_0 of the first semiconductor chip CHIP0 may generate the test mode signal TM<0:m> for an internal test operation. Thus, the Internal circuit of the first semiconductor chip CHIP0 may perform an individual test mode setting operation at step S850.

Then, the data DATA Inputted to the second and third semiconductor chips CHIP1 and CHIP2 may transition from a high level logic to a low level logic. Thus, the command controllers 230_1 and 230_2 of the second and third semiconductor chips CHIP1 and CHIP2 may deactivate the mask enable signal MASKEN at step S860.

Then, when a command CMD4 is inputted through the common command pins COMMAND PINs from the controller, the command decoders 210_0, 210_1, and 210_2 of the respective chips may decode the command CMD4 and generate the mode enable signal TEST_MD and the mode signal TM_CODE<0:n>. Each of bits TM_CODE<0> and TM_CODE<1> may have a value of 0 indicating that the common test mode ends. The test controllers 250_0, 250_1, and 250_2 of the respective chips may deactivate the common test mode signal TM_MASK in response to the bits TM_CODE<0> and TM_CODE<1> of the mode signal TM_CODE<0:n>. Thus, all of the semiconductor chips of the MCP may end the common test mode (YES at step S870).

Then, when the semiconductor chips enter the test mode and the command CMD indicating the test operation is inputted through the common command pins COMMAND PINs of the respective semiconductor chips, the command CMD may be decoded to activate the buffer enable signal BUFEN. The data input buffers 220_0, 220_1, and 220_2 of the respective semiconductor chips may be enabled in response to the activated buffer enable signal BUFEN, receive data DATA inputted through the individual data pins DATA I/O PINs, and perform a test operation according to preset individual test modes, at step S880.

In the embodiment of the present invention, although the same command is Inputted to the respective semiconductor chips of the MCP at the same time, the commands of the semiconductor chips other than the test target may be selectively blocked. Thus, only the semiconductor chip corresponding to the test target may be Independently tested.

Furthermore, the semiconductor chips of the MCP may be independently tested without separate pads added to the respective semiconductor chips. Thus, the area efficiency of the MCP may be improved.

Although various embodiments have been described for Illustrative purposes, it will be apparent to those skilled in the art that various changes and modifications may be made without departing from the spirit and scope of the invention as defined in the following claims.

What is claimed is:

1. A multi-chip package comprising a plurality of semiconductor chips integrated in a single package and sharing one or more command pins;
   wherein each of the semiconductor chips comprises:
   a command decoder suitable for decoding a command to generate a buffer enable signal, a mode enable signal, and a mode signal;
   a data input buffer suitable for buffering data to output internal data, in response to the buffer enable signal and a common test mode signal;
   a command controller suitable for receiving the mode enable signal to output a test mode enable signal by selectively blocking the mode enable signal based on the internal data inputted from the data input buffer, and the common test mode signal; and
   a test controller suitable for generating the common test mode signal and a test mode signal, based on the test mode enable signal and the mode signal,
   wherein the command controller comprises:
   a masking signal generation unit suitable for receiving the internal data to generate a mask enable signal, based on the common test mode signal; and
   a masking unit suitable for outputting the test mode enable signal by selectively blocking the mode enable signal based on the mask enable signal.

2. The multi-chip package of claim 1, wherein the masking signal generation unit activates the mask enable signal according to a value of the internal data when the common test mode signal is activated.

3. The multi-chip package of claim 1, wherein the masking signal generation unit deactivates the mask enable signal regardless of the value of the internal data when the common test mode signal is deactivated.

4. The multi-chip package of claim 1, wherein the masking signal generation unit comprises:
   a signal driving unit suitable for receiving the common test mode signal and the internal data to generate a pre-mask signal;
   a latch unit suitable for latching the pre-mask signal to output an inverted pre-mask signal; and
   a buffer unit suitable for buffering the inverted pre-mask signal to output the mask enable signal.

5. The multi-chip package of claim 4, wherein the signal driving unit comprises:
   a pull-up driving unit suitable for pull-up driving the pre-mask signal based on the common test mode signal;
   a logic circuit suitable for performing an AND operation on the common test mode signal and the internal data; and
   a pull-down driving unit suitable for pull-down driving the pre-mask signal based on an output signal of the logic circuit.

6. The multi-chip package of claim 1, wherein, when any one of the buffer enable signal and the common test mode signal is activated, the data input buffer buffers the data and outputs the internal data.

7. The multi-chip package of claim 1, wherein the data input buffer comprises:
   an enable signal generation unit suitable for receiving the buffer enable signal or the common test mode signal and generating first and second enable signals;
   an enable unit suitable for providing a driving voltage to a driving unit based on the first and second enable signals; and
   the driving unit suitable for driving the data to the internal data according to the driving voltage provided from the enable unit.

8. The multi-chip package of claim 1, wherein the test controller comprises:
   a common test mode signal generation unit suitable for generating the common test mode signal based on the test mode enable signal and some of bits of the mode signal; and
   a test mode signal generation unit suitable for generating the test mode signal based on the test mode enable signal and the mode signal.

9. The multi-chip package of claim 8, wherein the common test mode signal generation unit comprises a logic circuit suitable for receiving the test mode enable signal and the mode signal and performing an AND operation.

10. A multi-chip package system comprising:
    a multi-chip package comprising a plurality of semiconductor chips which share at least one command pin and are integrated in one package; and
    a controller suitable for transmitting a command to the multi-chip package and exchanging data corresponding to the command with the multi-chip package, wherein each of the semiconductor chips of the multi-chip package comprises a plurality of data pins, and selectively sets a test mode of a semiconductor chip to be tested by buffering data inputted through the data pins to output internal data, and blocking a command inputted through the command pin according to a value of the internal data in a common test mode,
    wherein each of the semiconductor chips comprises:
       a command decoder suitable for decoding the command inputted from the controller to generate a buffer enable signal, a mode enable signal, and a mode signal;
       a data input buffer suitable for buffering the data inputted from the controller to output the internal data, based on the buffer enable signal and a common test mode signal;
       a command controller suitable for receiving the mode enable signal to output a test mode enable signal by selectively blocking the mode enable signal based on the internal data and the common test mode signal; and
       a test controller suitable for generating the common test mode signal and a test mode signal, based on the test mode enable signal and the mode signal, wherein the command controller comprises:
          a masking signal generation unit suitable for receiving the internal data to generate a mask enable signal, based on the common test mode signal; and
          a masking unit suitable for outputting the test mode enable signal by selectively blocking the mode enable signal based on the mask enable signal.

11. The multi-chip package system of claim 10, wherein the masking signal generation unit activates the mask enable signal according to a value of the internal data when the common test mode signal is activated, and deactivates the mask enable signal regardless of the value of the internal data when the common test mode signal is deactivated.

12. The multi-chip package system of claim 10, wherein, when any one of the buffer enable signal and the common test mode signal is activated, the data input buffer buffers the data and outputs the internal data.

13. The multi-chip package system of claim 10, wherein the test controller comprises:
    a common test mode signal generation unit suitable for generating the common test mode signal based on the test mode enable signal and some of bits of the mode signal; and
    a test mode signal generation unit suitable for generating the test mode signal based on the test mode enable signal and the mode signal.

14. The multi-chip package system of claim 10, wherein the controller is included in a test apparatus.

* * * * *